United States Patent
Chung

(10) Patent No.: US 8,369,146 B2
(45) Date of Patent: Feb. 5, 2013

(54) BLOCK DECODER OF SEMICONDUCTOR MEMORY DEVICE

(75) Inventor: Sang Hwa Chung, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 169 days.

(21) Appl. No.: 12/982,070

(22) Filed: Dec. 30, 2010

(65) Prior Publication Data

US 2011/0157984 A1 Jun. 30, 2011

(30) Foreign Application Priority Data

Dec. 31, 2009 (KR) .................. 10-2009-0135631

(51) Int. Cl.
*G11C 11/34* (2006.01)
(52) U.S. Cl. ......... 365/185.11; 365/185.17; 365/185.18; 365/185.23; 365/185.33
(58) Field of Classification Search ............. 365/185.11, 365/185.17, 185.18, 185.23, 185.33
See application file for complete search history.

(56) References Cited

U.S. PATENT DOCUMENTS

| | | | | |
|---|---|---|---|---|
| 5,920,504 | A * | 7/1999 | Lee et al. | 365/185.11 |
| 6,044,017 | A * | 3/2000 | Lee et al. | 365/185.18 |
| 6,967,874 | B2 * | 11/2005 | Hosono | 365/185.33 |
| 7,495,965 | B2 * | 2/2009 | Suzuki et al. | 365/185.23 |
| 7,692,977 | B2 * | 4/2010 | Kim et al. | 365/185.18 |

FOREIGN PATENT DOCUMENTS

| | | |
|---|---|---|
| KR | 1020020038862 A | 5/2002 |
| KR | 1020090011210 A | 2/2009 |

* cited by examiner

*Primary Examiner* — Trong Phan
(74) *Attorney, Agent, or Firm* — William Park & Associates Ltd.

(57) ABSTRACT

A block decoder of a semiconductor memory device includes a control signal generation circuit configured to generate an initial control signal and a block selection control signal in response to memory block selection addresses, an output node control circuit configured to set up an initial voltage of an output node in response to the initial control signal, and a block selection signal generation circuit configured to generate a block selection signal by raising a potential of the output node in response to the block selection control signal and the initial voltage of the output node.

13 Claims, 3 Drawing Sheets

BLOCK DECODER OF SEMICONDUCTOR MEMORY DEVICE

CROSS-REFERENCE TO RELATED APPLICATION

Priority to Korean patent application number 10-2009-0135631 filed on Dec. 31, 2009, the entire disclosure of which is incorporated by reference herein, is claimed.

BACKGROUND

Exemplary embodiments relate to the block decoder of a semiconductor memory device and, more particularly, to the block decoder of a semiconductor memory device.

Recently, there is an increasing demand for semiconductor memory devices which can be electrically programmed and erased and which do not require the refresh function of rewriting data at specific intervals. In order to develop high-capacity memory devices capable of storing a large amount of data, research is being done on technologies for improving the degree of integration of memory devices. To this end, active research is being carried out on flash memory.

Flash memory is chiefly divided into NAND type flash memory and NOR type flash memory. The NOR type flash memory has an excellent random access time characteristic because memory cells are independently coupled to bit lines and word lines. The NAND type flash memory is excellent in terms of the degree of integration because a plurality of memory cells is coupled together in series and so each cell string requires, for example, only one contact. Accordingly, the NAND type flash memory may be used in high integration nonvolatile memory.

In general, a flash memory device includes a block decoder for selecting a memory cell array on a block basis in order to perform a program, a read, and an erase operation.

FIG. 1 is a circuit diagram of a flash memory device for illustrating a known block decoder.

Referring to FIG. 1, a NAND gate ND1 logically combines received address signals XA, XB, XC, and XD, and a NAND gate ND2 logically combines a program precharge signal PGMPREb and the output signal of the NAND gate ND1. When at least one or more of the address signals XA, XB, XC, and XD are in a low level, the NAND gate ND1 outputs a signal of a high level. When one or more of the program precharge signal PGMPREb and the output signal of the NAND gate ND1 are in a low level, the NAND gate ND2 outputs a signal of a high level. Additionally, Vcc represents a power source, Vss represents a around power source, GDSL is a global drain selection line, and GSSL is a global source selection line.

A NAND gate ND3 logically combines a block enable signal EN and the output signal of the NAND gate ND2. When the block enable signal EN is in a low level, the NAND gate ND3 outputs a signal of a high level, and so a transistor N2 is turned on. Accordingly, a node Q1 is reset.

A transistor N1 is turned on in response to a precharge signal PRE so that the output signal of the NAND gate ND2 is supplied to the node Q1. Here, a potential of the node Q1 serves as a block selection signal BLKWL. Meanwhile, transistors N3 and N4 are turned on in response to first and second control signals GC and GB of a pumping voltage (Vpp) level, respectively, and so the pumping voltage Vpp is supplied to the node Q1. In response to the potential of the node Q1 (that is, the block selection signal BLKWL), a block switch 20 is operated, and so global word lines GWL<31:0> and the word lines of a memory cell array 30 are connected.

FIG. 2 shows the arrangement of signal lines used in the block decoder circuit of FIG. 1.

Referring to FIG. 2, according to an example, a plurality of metal lines for receiving signals to control a block decoder is arranged beside a plurality of memory blocks (for example, 2048). From among the metal lines, metal lines for receiving address signals XA<3:0>, XB<7:0>, XC<7:0>, and XD<7:0> are used to receive coding signals to select a memory block and composed of 28 lines. Furthermore, metal lines for receiving first and second control signals GB<7:0> and GC<7:0> obtained by decoding the address signals XB<7:0> and XC<7:0> are arranged in a region adjacent to the plurality of memory blocks. Here, assuming that the line width of each of the metal lines for receiving the first and second control signals GB<7:0> and GC<7:0> is 0.5 µm and the interval between the metal lines is 0.5 µm, a total space of 16 µm is required.

BRIEF SUMMARY

Exemplary embodiments relate to a block decoder reducing the area occupied by metal lines for high voltage address signals and generating a block selection signal by using a depletion high voltage NMOS transistor and a high voltage PMOS transistor.

The block decoder of a semiconductor memory device according to an exemplary embodiment of the present invention includes a control signal generation circuit configured to generate an initial control signal and a block selection control signal in response to memory block selection addresses, an output node control circuit configured to set up an initial voltage of an output node in response to the initial control signal, and a block selection signal generation circuit configured to generate a block selection signal by raising a potential of the output node in response to the block selection control signal and the initial voltage of the output node.

The block decoder of a semiconductor memory device according to another exemplary embodiment of the present invention includes a control signal generation circuit configured to generate an initial control signal and a block selection control signal in response to a plurality of decoded address signals, a block selection signal generation circuit configured to generate a block selection signal by supplying a block bias to an output node in response to the block selection control signal, and an output node determination circuit configured to discharge the output node or precharge the output node to a certain potential in response to the initial control signal.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the present invention.

Figure 1:
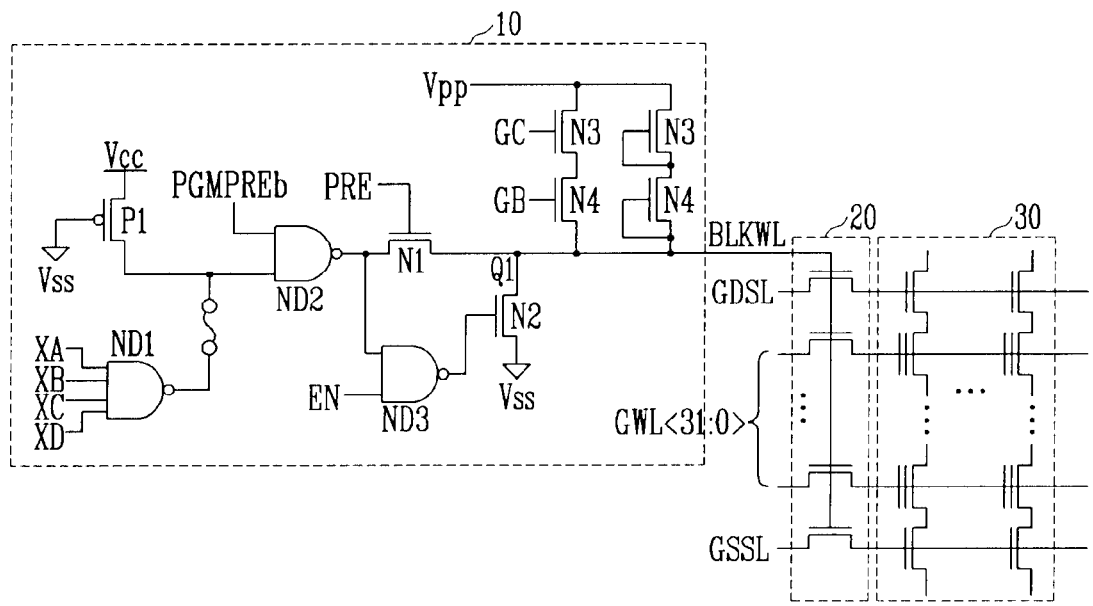
FIG. 1 is a circuit diagram of a flash memory device for illustrating a known block decoder.
Figure 2:
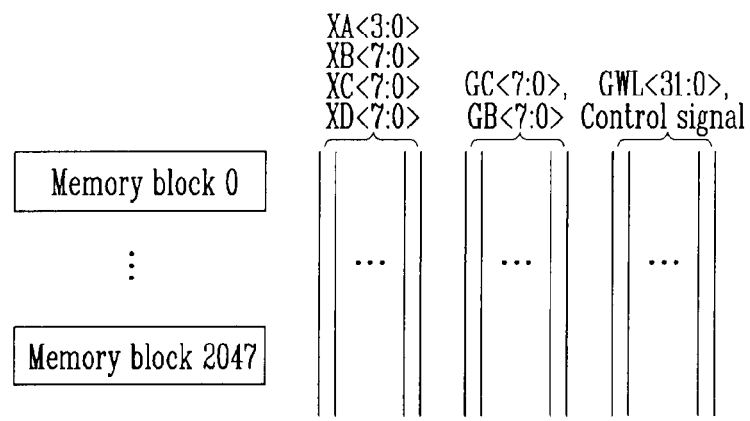
FIG. 2 shows the arrangement of signal lines used in the block decoder circuit of FIG. 1.
Figure 3:
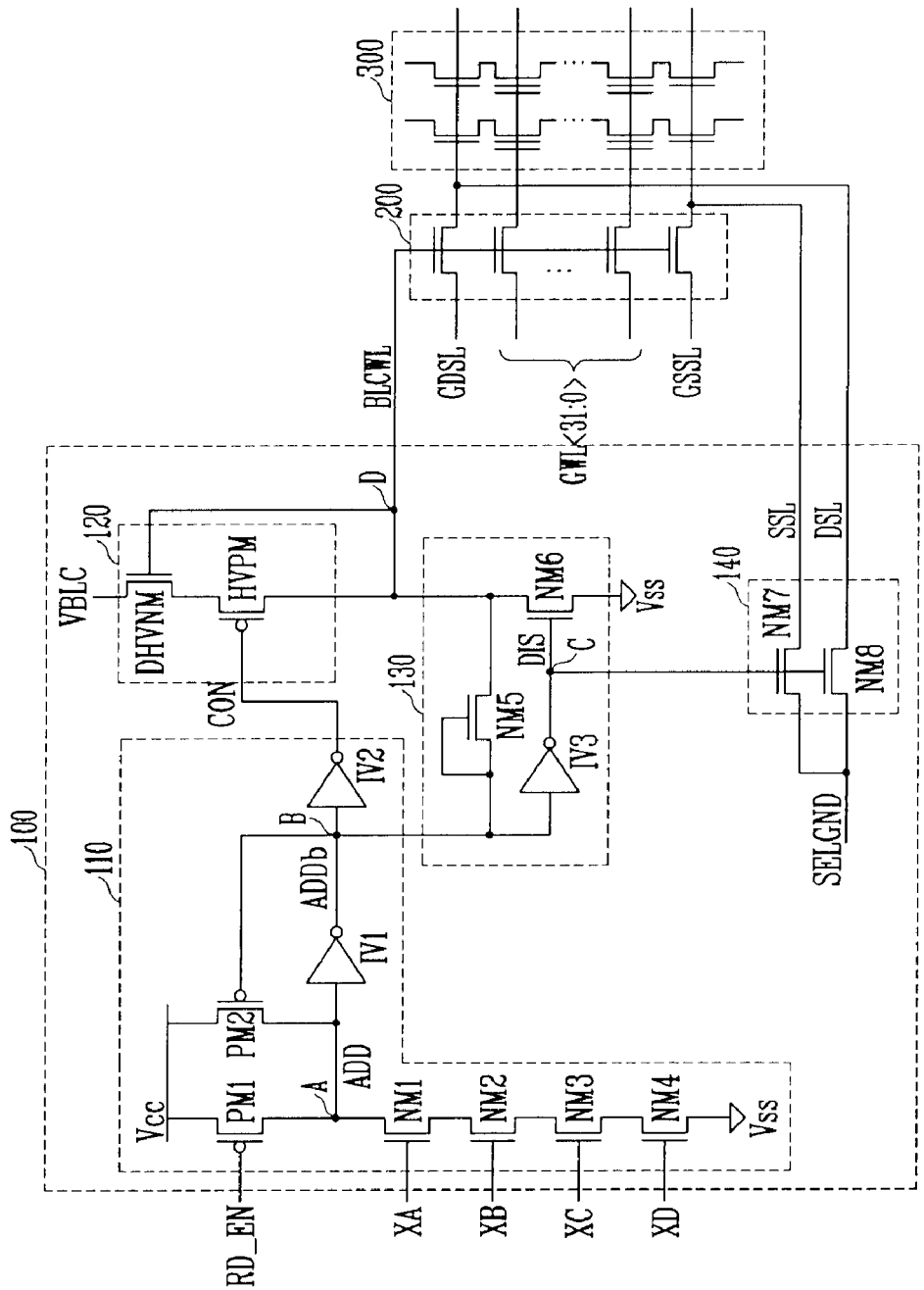
FIG. 3 is a circuit diagram of a semiconductor memory device for illustrating the block decoder of a semiconductor memory device according to an exemplary embodiment of the present invention.

FIG. 3 is a circuit diagram of a semiconductor memory device for illustrating the block decoder of a semiconductor memory device according to an exemplary embodiment of the present invention.

Referring to FIG. 3, the block decoder 100 includes a control signal generation circuit 110, a block selection signal generation circuit 120, a discharge circuit 130, and a selection line control circuit 140.

The control signal generation circuit 110 generates a block selection control signal CON to control the block selection signal generation circuit 120 in response to a plurality of decoded address signals XA, XB, XC, and XD.

The block selection signal generation circuit 120 generates a block selection signal BLCWL in response to the block selection control signal CON.

The discharge circuit 130 discharges a potential of the output node D of the block selection signal generation circuit 120 in response to an initial control signal ADDb generated within the control signal generation circuit 110.

The selection line control circuit 140 supplies a ground voltage SELGND to the drain selection line DSL and the source selection line SSL of a memory cell array according to a potential of the node C of the discharge circuit 130.

The control signal generation circuit 110 includes a plurality of NMOS transistors NM1 to NM4, PMOS transistors PM1 and PM2, and inverters IV1 and IV2. The PMOS transistor PM1 is coupled between a power source voltage (Vcc) terminal and a first node A, and configured to supply the power source voltage Vcc to the first node A in response to an enable signal RD_EN. The NMOS transistors NM1 to NM4 are coupled in series between the first node A and a ground power source Vss. The NMOS transistors NM1 to NM4 supply the ground voltage of the ground power source Vss to the first node A in response to respective decoded address signals XA, XB, XC, and XD. In response to the decoded address signals XA, XB, XC, and XD, a potential of the first node A is controlled, and an address signal ADD is output according to a potential of the first node A. The inverters IV1 and IV2 are coupled in series to the first node A. The inverter IV1 generates the initial control signal ADDb by inverting the address signal ADD. The inverter IV2 generates the block selection control signal CON by inverting the initial control signal ADDb. The PMOS transistor PM2 is coupled between the power source voltage (Vcc) terminal and the first node A, and configured to supply the power source voltage Vcc to the first node A in response to the initial control signal ADDb.

When the control signal generation circuit 110 is activated in response to the enable signal RD_EN and all the decoded address signals XA, XB, XC, and XD are a high level, the control signal generation circuit 110 outputs the block selection control signal CON of a low level. When one or more of the decoded address signals XA, XB, XC, and XD are in a low level, the control signal generation circuit 110 outputs the block selection control signal CON of a high level.

The block selection signal generation circuit 120 includes a depletion high voltage NMOS transistor DHVNM and a high voltage PMOS transistor HVPM. The depletion high voltage NMOS transistor DHVNM and the high voltage PMOS transistor HVPM are coupled in series between a block bias (VBLC) terminal and the output node D. The high voltage PMOS transistor HVPM is turned on in response to the block selection control signal CON. The depletion high voltage NMOS transistor DHVNM controls the current of the block bias VBLC supplied according to a potential of the output node D. The depletion high voltage NMOS transistor DHVNM usually has a negative threshold voltage. Thus, even though voltage of 0 V is supplied to the gate of the depletion high voltage NMOS transistor DHVNM, current flows through the depletion high voltage NMOS transistor DHVNM. Further, the depletion high voltage NMOS transistor DHVNM may have a negative threshold voltage although its threshold voltage rises by means of the body effect.

The discharge circuit 130 includes NMOS transistors NM5 and NM6 and an inverter IV3. The NMOS transistor NM5 is diode-coupled between the second node B of the control signal generation circuit 110 and the output node D of the block selection signal generation circuit 120. The NMOS transistor NM5 may be formed of a high voltage NMOS transistor. The NMOS transistor NM5 precharges the output node D to a potential of Vdd−Vt (NM5) when the initial control signal ADDb of the second node B is in a high level (Vdd) level. The inverter IV3 is coupled between the second node B of the control signal generation circuit 110 and the third node C of the discharge circuit 130, and configured to generate the discharge signal DIS in response to the initial control signal ADDb. The inverter IV3 may have a higher beta ratio than the inverter IV2. In this case, if the size of a PMOS transistor is increased, the inverter IV2 is inverted to a logic low level at a higher bias than a common inverter which is inverted to a logic low level at Vdd/2. Furthermore, if the size of an NMOS transistor increases, the inverter IV3 is inverted to a logic low level at a lower bias than a common inverter which is inverted to a logic low level at Vdd/2. Accordingly, when the initial control signal ADDb shifts to a high level, the discharge signal DIS shifts to a low level earlier than the block selection control signal CON, and so a DC pass may not be formed.

The selection line control circuit 140 includes NMOS transistor NM7 and NM8. The NMOS transistor NM7 supplies the ground voltage SELGND to the source selection line SSL of a memory cell array 300 in response to the discharge signal DIS. The NMOS transistor NM8 supplies the ground voltage SELGND to the drain selection line DSL of the memory cell array 300 in response to the discharge signal DIS. The NMOS transistors NM7 and NM8 may be formed of high voltage NMOS transistors. Additionally, FIG. 3 illustrates a global drain selection line GDSL and a global source selection line GSSL.

Figure 4A:
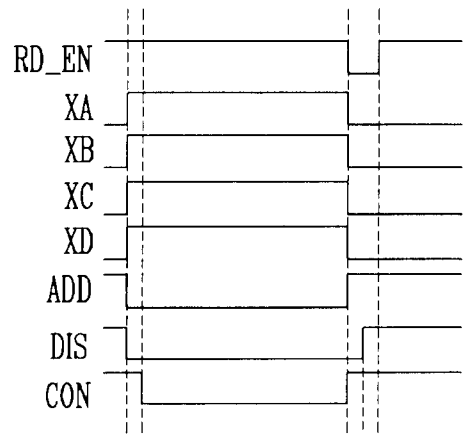
FIG. 4A shows a waveform of signals for illustrating an operation of selecting a memory block according to an exemplary embodiment of the present invention.

FIG. 4A shows a waveform of signals for illustrating an operation of selecting a memory block according to an exemplary embodiment of the present invention.

Figure 4B:
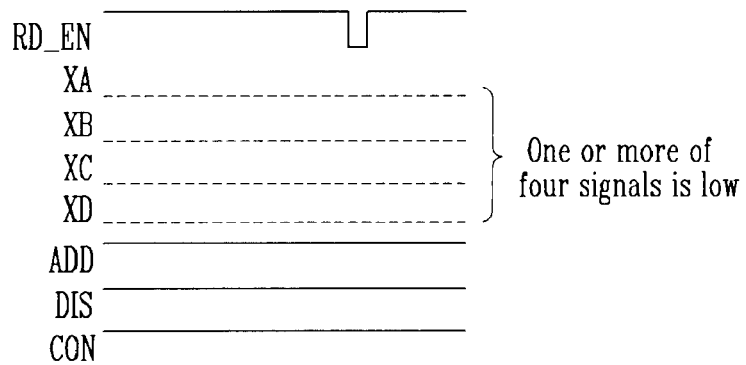
FIG. 4B shows a waveform of signals for illustrating an operation of not selecting a memory block according to an exemplary embodiment of the present invention.

FIG. 4B shows a waveform of signals for illustrating an operation of not selecting a memory block according to an exemplary embodiment of the present invention. FIG. 4B also indicates that one or more of four signals (i.e., XA, XB, XC, and XD) is low.

Figure 5:
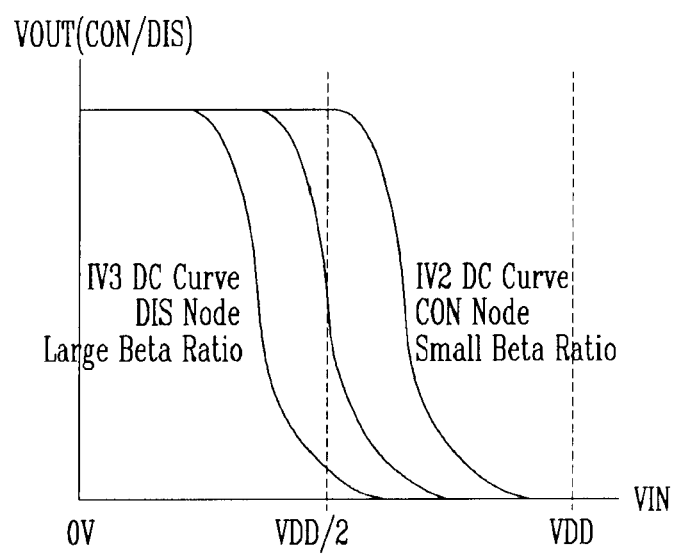
FIG. 5 shows a beta ratio characteristic curve of an inverter.

FIG. 5 shows a beta ratio characteristic curve of the inverter. For example, FIG. 5 illustrates an inverter having a large beta ration through the illustration of the DC curve of inverter IV3 for the node associated with the DIS signal. Also, for example, FIG. 5 illustrates an inverter having a small beta ratio through the illustration of the DC curve of inverter IV2 for the node associated with the CON signal. FIG. 5 having the y-axis marked as voltage out VOUT for signals CON and DIS (i.e., (CON/DIS)) and the x-axis marked as voltage in VIN. The x-axis having voltage values of 0V, VDD/2, and VDD.

An operation of the block decoder of the semiconductor memory device according to an exemplary embodiment of the present invention is described below with reference to FIGS. 3 to 5.

(1) In Case where a Corresponding Memory Block is a Selected Memory Block

The PMOS transistor PM1 of the control signal generation circuit 110 is turned off in response to the enable signal RD_EN of a high level. Thus, the supply of the power source voltage Vcc to the first node A is cut off. In case where a corresponding memory block is a selected memory block, all the decoded signals XA, XB, XC, and XD of a high level are supplied to the control signal generation circuit 110. Accordingly, the ground power source Vss is supplied to the first node A, and so the address signal ADD of a low level is output.

The inverter IV1 generates the initial control signal ADDb of a high level by inverting the address signal ADD of a low level. The inverter IV2 generates the block selection control signal CON of a low level by inverting the initial control signal ADDb of a high level. Further, the inverter IV3 generates the discharge signal DIS of a low level by inverting the initial control signal ADDb of a high level. Here, the discharge signal DIS shifts to a low level earlier than the block selection control signal CON. This is based on the beta ratio of an inverter shown in FIG. 5. An inverter having a high beta ratio generates a logic low level at a lower bias than an inverter having a low beta ratio.

The NMOS transistor NM5 of the discharge unit 130 precharges the output node D to a potential of Vdd−Vt (NM5). Further, the NMOS transistor NM5 is turned off in response to the discharge signal DIS of a low level. Further, the selection line control circuit 140 is inactiavated in response to the discharge signal DIS of a low level.

The high voltage PMOS transistor HVPM of the block selection signal generation circuit 120 is turned on in response to the block selection control signal CON of a low level. Here, the depletion high voltage NMOS transistor DHVNM repeats an operation of precharging the output node D to a potential of −1×Vt (DHVNM)+Vdd−Vt (NM5) on the basis of the potential of the output node D precharged to the potential of Vdd−Vt (NM5) and precharging the output node D to a potential of −1×Vt (DHVNM)+Vdd−Vt (NM5)+Vdd−Vt (DHVNM) on the basis of a raised potential of the output node D. Consequently, a potential of the output node D is raised up to a level of the block bias VBLC. Accordingly, the block selection signal BLCWL having the same level as the block bias VBLC is output. Consequently, the high voltage transistors of a pass selection unit 200 are turned on, and the memory cell array 300 and global word lines GWL<31:0> are connected.

(2) In Case where a Corresponding Memory Block is an Unselected Memory Block

The PMOS transistor PM1 of the control signal generation circuit 110 is turned off in response to the enable signal RD_EN of a high level. Thus, the supply of the power source voltage Vcc to the first node A is cut off. In case where a corresponding memory block is an unselected memory block, at least one or more of the decoded signals XA, XB, XC, and XD are supplied to the control signal generation circuit 110 as a low level. Accordingly, the first node A is maintained at the power source voltage (Vcc) level, and so the address signal ADD of a high level is output.

The inverter IV1 generates the initial control signal ADDb of a low level by inverting the address signal ADD of a high level. The inverter IV2 generates the block selection control signal CON of a high level by inverting the initial control signal ADDb of a low level. Further, the inverter IV3 generates the discharge signal DIS of a high level by inverting the initial control signal ADDb of a low level. The NMOS transistor NM6 is turned on in response to the discharge signal DIS of a high level. Thus, the ground power source Vss is supplied to the output node D.

The selection line control circuit 140 is activated in response to the discharge signal DIS of a high level. Accordingly, the ground voltage SELGND is supplied to the source selection line SSL and the drain selection line DSL of the corresponding memory cell array 100.

The high voltage PMOS transistor HVPM of the block selection signal generation circuit 120 is turned off in response to the block selection control signal CON of a high level. Accordingly, the output node D is maintained at a low level, and so the block selection signal BLCWL of a low level is output. Consequently, the high voltage transistors of the pass selection unit 200 are turned off, and the connection of the memory cell array 300 and the global word lines GWL<31:0> are cut off.

In accordance with the exemplary embodiment of the present invention, in the block decoder of a semiconductor memory device, the control signal and the discharge signal are controlled in response to the decoded address signals so that they are output with a time lag, instead of using the high voltage address signals. Accordingly, the area occupied by metal lines for high voltage address signals may decrease. Furthermore, a level of the block selection signal may be raised by using a depletion high voltage NMOS (DHVNM) transistor and a high voltage PMOS (HVPM) transistor.

What is claimed is:

1. A block decoder of a semiconductor memory device, comprising:
   a control signal generation circuit configured to generate an initial control signal and a block selection control signal in response to memory block selection addresses;
   an output node control circuit configured to set up an initial voltage of an output node in response to the initial control signal; and
   a block selection signal generation circuit configured to generate a block selection signal by raising a potential of the output node in response to the block selection control signal and the initial voltage of the output node.

2. The block decoder of claim 1, further comprising a selection line control circuit configured to supply a ground voltage to a drain selection line and a source selection line of a memory cell array in response to the initial control signal.

3. The block decoder of claim 1, wherein the control signal generation circuit is configured to output the block selection control signal activated when all the memory block selection addresses are activated.

4. The block decoder of claim 1, wherein:
   the control signal generation circuit is configured to generate the block selection control signal by inverting the initial control signal using a first inverter, and
   the output node control circuit is configured to generate a discharge signal by inverting the initial control signal using a second inverter.

5. The block decoder of claim 4, wherein the second inverter has a higher beta ratio than the first inverter.

6. The block decoder of claim 4, wherein when the initial control signal is activated, the discharge signal is activated earlier than the block selection control signal.

7. The block decoder of claim 1, wherein the block selection signal generation circuit comprises a depletion high voltage NMOS transistor and a high voltage PMOS transistor coupled in series between the output node and a node for supplying a block bias.

8. The block decoder of claim 7, wherein the depletion high voltage NMOS transistor supplies the block bias in response to the potential of the output node so that a level of the block selection signal rises up to a level of the block bias.

9. The block decoder of claim 1, wherein the control signal generation circuit is configured to generate the block selection control signal by inverting the initial control signal.

10. The block decoder of claim 1, wherein the output node control circuit is configured to generate a discharge signal by inverting the initial control signal.

11. A block decoder of a semiconductor memory device, comprising:

a control signal generation circuit configured to generate an initial control signal and a block selection control signal in response to a plurality of decoded address signals;

a block selection signal generation circuit configured to generate a block selection signal by supplying a block bias to an output node in response to the block selection control signal; and an output node determination circuit configured to discharge the output node or precharge the output node to a certain potential in response to the initial control signal.

12. The block decoder of claim 11, wherein the block selection signal generation circuit comprises a depletion high voltage NMOS transistor and a high voltage PMOS transistor coupled in series between the output node and a node for supplying the block bias.

13. The block decoder of claim 12, wherein the depletion high voltage NMOS transistor supplies the block bias to the output node in response to a potential of the output node.

* * * * *